United States Patent [19]
Enderson

[11] 4,414,689
[45] Nov. 8, 1983

[54] SQUELCH CIRCUIT

[75] Inventor: Eugene S. Enderson, Robins, Iowa

[73] Assignee: Rockwell International Corporation, El Segundo, Calif.

[21] Appl. No.: 453,647

[22] Filed: Dec. 27, 1982

Related U.S. Application Data

[63] Continuation of Ser. No. 271,767, Jun. 9, 1981, abandoned.

[51] Int. Cl.³ .............................................. H04B 1/10
[52] U.S. Cl. .................................... 455/221; 455/225; 455/303; 381/57
[58] Field of Search ................ 455/212, 218, 221–225, 455/303; 179/1 P, 1 SC; 328/167

[56] References Cited

U.S. PATENT DOCUMENTS 3,102,236 8/1963 Eichenberger et al. ............. 455/221
3,350,650 10/1967 Kemper ............................... 455/224
4,187,396 2/1980 Luhony ................................ 179/1 P Primary Examiner—Jin F. Ng
Attorney, Agent, or Firm—Richard K. Robinson; Howard R. Greenberg; H. Fredrick Hamann

[57] ABSTRACT

A squelch circuit for a radio receiver provides for applying the audio signal that has been detected and demodulated to both a low pass channel and high pass channel. The low pass channel passes the audio signal to a low frequency bandpass filter where only the lower frequencies of the demodulated signal are passed. The filtered signal is then average by an averaging detector where the average of the energy contained within the signal is obtained and monitored by a syllabic detector, which upon the occurrence of certain pre-established varying energy levels will indicate the presence of speech in the demodulated signal. The high pass channel includes a high frequency bandpass filter for passing signals with a frequency that is greater than the frequencies of those signals passed by the low frequency bandpass filter, a peak detector for detecting the concentration of signal energy and a level comparator for comparing the output of the averaging detector with the peak detector and to provide a positive indication when the average level is greater than the peak level. The output from the high pass channel and the low pass channel are ANDed together to provide a signal that will operate an audio gate for passing the demodulated signal on to the output means, when the output from the high pass channel, and the output from the low pass channel are ANDed together and provide a positive indication.

5 Claims, 2 Drawing Figures

SQUELCH CIRCUIT

This is a continuation of application Ser. No. 271,767, filed June 9, 1981, now abandoned.

BACKGROUND OF THE INVENTION

This invention relates to Squelch Circuits for radio receivers and in particular, to squelch circuits with automatic level control.

A squelch circuit can be defined as a circuit that causes the audio signal to be applied to an output device, such as a headset or speaker system, only during the reception of a modulated voice signal. An example of a prior art squelch circuit is disclosed in U.S. Pat. No. 3,102,236 and has as a distinguishing feature the ability to keep the squelch circuit from triggering, and activating the audio output device on a continuous tone. This is accomplished through the use of a syllabic rate filter rather than a two channel energy distribution comparison circuit which was the dominant method used in the prior art.

The prior art squelch circuits required that the operator of a radio receiver manually adjust the noise level control to either increase the sensitivity of the radio so that the desired audio signal may be passed to the audio output device or to increase the noise threshold to prevent noise from triggering the squelch circuit. Airborne radios are very susceptible to varying noise levels and consequently require a substantial amount of manual intervention for adjustment of each level as the aircraft in which these radios are mounted flies through different atmospheric conditions or changes from flying over land to flying over water. The change in the atmospheric conditions will at times, cause the prior art squelch circuits to switch on when there is nonintelligible information being broadcast, and thus distract the operator who in most cases is the pilot of the aircraft, and thus this action creates a safety hazard or lack of communications because of audio fatigue. Audio fatigue is defined as a condition where an operator as a result of prolonged listening to audio noise disables, "turns off," the radio receivers.

SUMMARY OF THE INVENTION

A squelch circuit for a radio receiver provides for applying the audio signal that has been detected and demodulated to both a low pass channel and a high pass channel. The low pass channel passes the audio signal to a low frequency bandpass filter where only the lower frequencies of the demodulated signal are passed. The filtered signal is then averaged by an averaging detector where the average of the energy contained within the signal is obtained and monitored by a syllabic detector, which upon the occurrence of certain pre-established energy levels will indicate the presence of speech in the demodulated signal. The high pass channel includes a high frequency bandpass filter for passing signals with frequencies that is greater than the frequencies of those signals passed by the low frequency bandpass filter, a peak detector for detecting concentration of signal energy and a level comparator for comparing the output of the averaging detector with the peak detector and to provide a positive indication that the average level is greater than the peak level. The output from the high pass channel and the low pass channel are and together to provide a signal that will operate an audio gate for passing the demodulated signal on to the output means, when the output from the high pass channel and the output from the low pass channel are and together and provide a positive indication.

There is additional circuitry provided for manual signal-to-noise level control for the averaging detector and a time delay circuit that prevents the audio gate from deactivating during brief speech pulses in the audio signal.

It is an object of this invention to provide a squelch circuit for a radio receiver that is immune to atmospheric noise level changes.

It is another object of this invention to provide a squelch circuit that will only activate the audio gate when speech is present in the demodulated signal from the radio receiver.

It is yet another object of this invention to provide a squelch circuit that will only break (activate the audio gate) for a preselected signal-to-noise ratio.

It is still another object of this invention to provide a squelch circuit that may be used with a radio that utilizes any of the known types or methods of transmitting audio information including AM, FM, single side band, citizen band, and high frequency bands.

BRIEF DESCRIPTION OF THE DRAWINGS

The advantages of the present invention may be ascertained from a reading of the specification and the claims in conjunction with the drawings in which:

DETAILED DESCRIPTION OF THE PREFERRED EMBODIMENT

Figure 1:
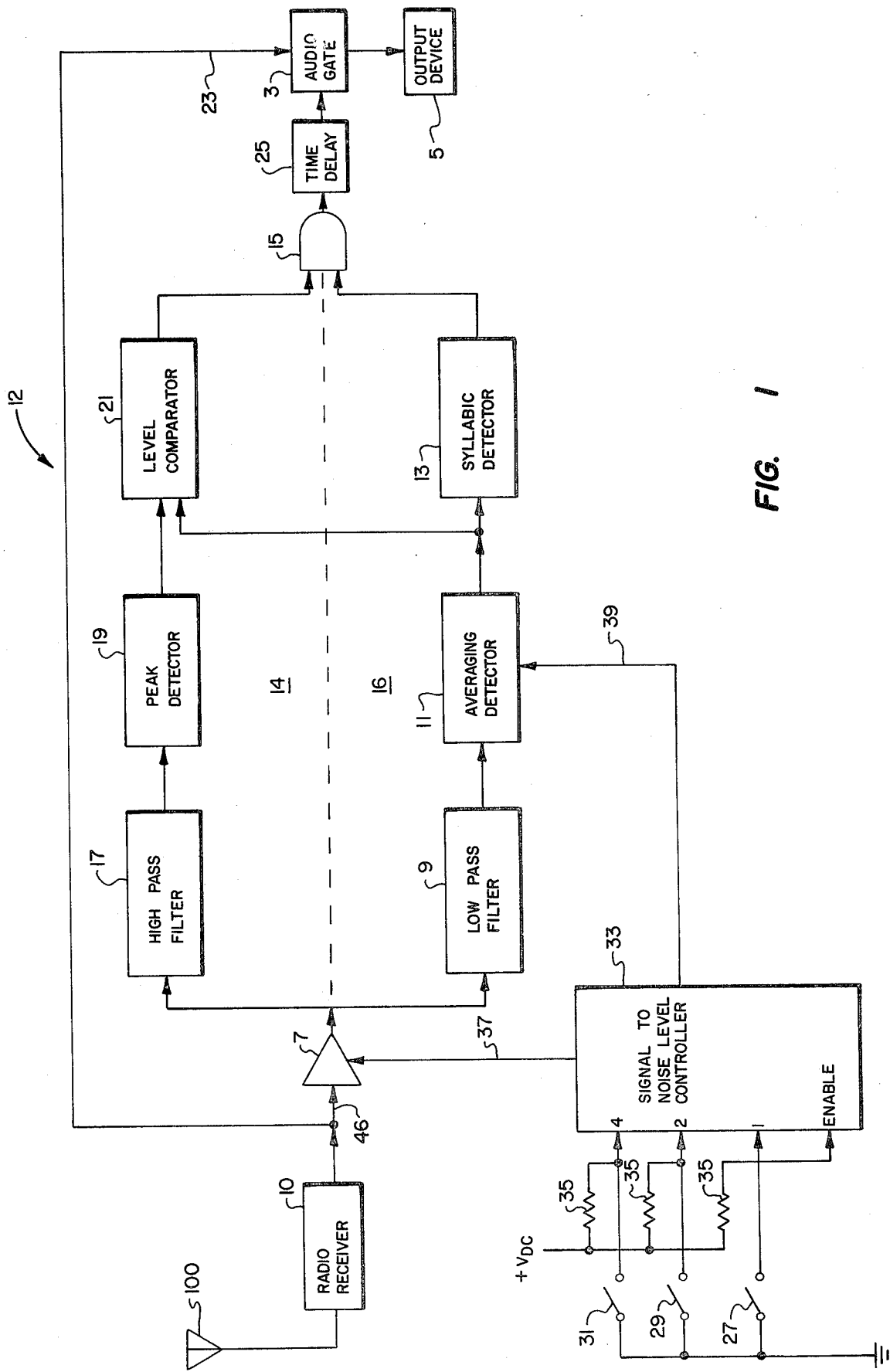
FIG. 1 is a block diagram of a radio receiver that includes a squelch circuit according to the invention.

In FIG. 1, to which reference should now be made, there is shown a radio receiver 10, which receives a radio frequency signal via the antenna 1 for demodulation. If there is speech demodulated by the radio receiver 10, a squelch circuit 12 will activate the audio gate 3, and apply the demodulated signal to the output device 5, which in the preferred embodiment includes an audio amplifier and an audio speaker. The squelch circuit 12 detects audio or speech in the demodulated signal that is provided on the output of the radio receiver 10 by applying the demodulated signal to a high pass channel 14, and a low pass channel 16, via the amplifier 7.

Low pass channel 16 consists of a low frequency bandpass filter 9 that in the preferred embodiment has a 600 hertz center frequency with a 300 hertz bandwidth. The filtered signal is applied to the averaging detector 11 which detects the average energy that is contained within the filtered signal that is provided to the averaging detector by the low frequency bandpass filter 9. A syllabic detector 13 utilizes the signal that is provided by the averaging detector 11 which shows the average energy that is associated with the signal that was passed by the low frequency bandpass filter 9 for speech detection. The signal from the averaging detector 11 is a varying DC signal and as such the syllabic detector 13 may detect a slowly varying signal which indicates that the demodulated signal from the radio receiver 10 contains speech. The syllabic detector 13 upon the detection of speech or audio within the signal that is provided from the radio receiver 10 will provide a signal that is the equivalent of a logic one to AND gate 15 which depending on the logic level from the output of the high pass channel 14 provides an activate signal to the audio gate 3.

The demodulated signal from the radio receiver 10 is also applied via the amplifier 7 to the high pass channel 14 that includes a high frequency bandpass filter 17 which in the preferred embodiment has a center frequency of approximately 2300 hertz and a bandwidth of 300 hertz. The output from the high frequency bandpass filter 17 is applied to a peak detector 19, which detects the presence of momentarily increases in the energy contained within the signal that has been passed by the high frequency bandpass filter 17. The output from the peak detector 19, is applied to a level comparator 21, where the level from the averaging detector 11 is compared with the level of the signal of the peak detector 19. The level comparator 21 will provide a logic one output signal to the AND gate 15 only if the signal level of the output from the peak detector 19 is less than the output of the averaging detector 11. The overall results of the comparison implemented by the level comparator 21 of the signals from the peak detector 19 and the averaging detector 11 eliminate the activation of the audio gate 3 due to sudden increases in background noise.

When there is a positive logic one output from both the high pass channel 14 and the low pass channel 16, the AND gate 15, as was mentioned earlier, activates the audio gate 3 which passes the demodulated signal from the radio receiver 10 that is applied to the audio gate 3 via conductor 23 to the output device 5 where the signal in the preferred embodiment is amplified and conveyed to an operator by way of an audio speaker or headset.

There are situations where the audio gate 3 may be inadvertently deactivated by the squelch circuit due to a pause in the speech pattern. To avoid the above-identified problem there is provided a time delay 25 for delaying the change in logic level of the output from the AND gate 15 to audio gate 3 by a preselected amount of time.

The threshold of the averaging detector 11 can be manually adjusted by a signal-to-noise controller 33 responding to the setting of an enable switch 27 which also selects the first level for the averaging detector 11 or the second level switch 29 or the third level switch 31. The signal-to-noise controller 33 enables the amplifier 7 by applying a signal to the amplifier 7 via conductor 37. Conductor 39 is the conductor that selects the levels that are applied to the averaging detector 11 by the signal-to-noise controller 33.

Figure 2:
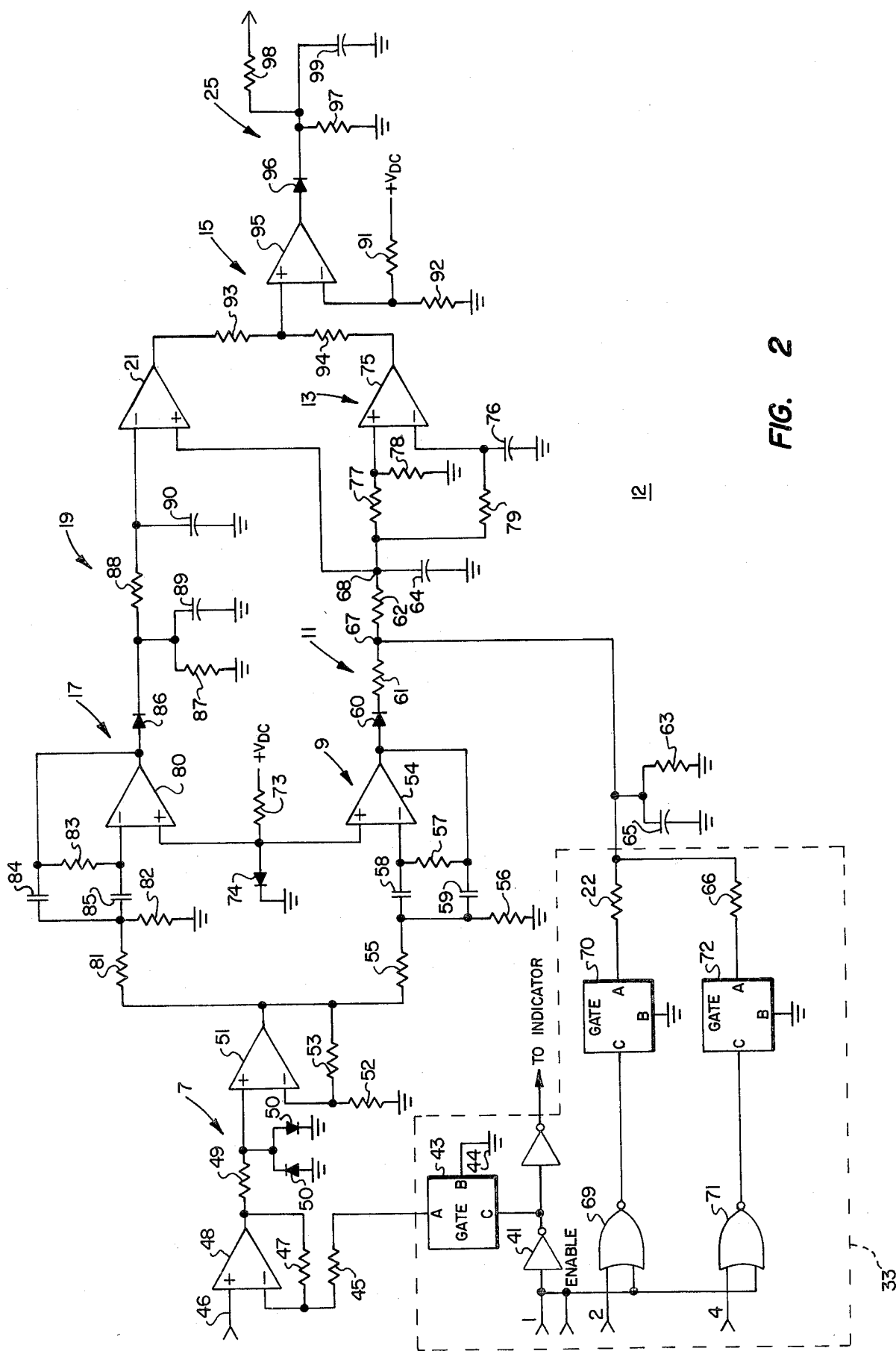
FIG. 2 is a schematic diagram of the squelch circuit of FIG. 1.

FIG. 2 is a schematic diagram of the squelch circuit 12 of FIG. 1, and provides for enabling of the amplifier 7 by the closing of enable switch 27 of FIG. 1 pulling the enable input, as well as the select 1 level control switch to ground 44, and thus causing the inverter 41 of FIG. 2 to provide a positive output that is at gate 43. The gate 43 goes from data mode to audio mode and in the preferred embodiment is a field effect transistor (FET) switch that switches the lead that is connected to A terminal to its B terminal in response to a positive logic level being provided to the C terminal. When this happens a resistor 45 is connected to the ground 44, thus enabling an input amplifier 48 that is part of the amplifier 7. When the input amplifier 48 is enabled the signal that is present on conductor 46, which is the output of the radio receiver 10 of FIG. 1, is amplified. The gain of the amplifier 48 is established by the resistor 45 and the feedback resistor 47. The output of the input amplifier is applied to an operational amplifier 51 for additional amplification via resistor 49. The positive input of operational amplifier 51 is protected by the back to back diodes 50 which are connected from the positive terminal of the operational amplifier 51 to the ground 44 and act as "glich eaters" to prevent high transient from damaging the operational amplifier 51. Resistor 52, that is connected between the negative input terminal of the operational amplifier 51 and chassis ground, and feedback resistor 53 establish the gain of the operational amplifier 51. The output of the operational amplifier 51 is applied to the high pass channel 14 and the low pass channel 16.

The high frequency bandpass filter 17, and the low frequency bandpass filter 9, are both active filter circuits and have similar configurations. The bandpass of the filters are determined by the selection of the components that are utilized in fabricating the filter circuit.

Table 1 is a listing of the component shown in FIG. 2 according to the reference numbers and provides a listing of the components for the high frequency bandpass filter 17, and the low frequency bandpass filter 9, used in the preferred embodiment to provide a center frequency of approximately 2300 hertz with a bandwith of 300 hertz for the high frequency bandpass filter 17, and a center frequency of 600 hertz with a bandwith of 300 hertz for the low frequency bandpass filter 9.

The low frequency bandpass filter 9 receives the amplified demodulated signal from the amplifier 7, and includes an operational amplifier 54 with the response being determined by resistors 55, 56, and 57, and capacitors 58 and 59, with the filter output from the operational amplifier 54 being applied to the averaging detector 11.

The averaging detector 11 includes a detector diode 60 and an integrator circuit that is made from the noise level selection resistors 22 or 66, resistors 61, 62, and 63, as well as capacitors 64 and 65. The detector diode 60 passes that portion of the filtered signal from the low frequency bandpass filter 9 that is of a greater amplitude than the signal level that results from the charge that is stored by the capacitor 65. The averaging detector 11 averages the peaks and valleys of the low frequency bandpass filter's varying DC signal that is passed by the detector diode 60. The amplitude of the voltage that can be measured at nodes 67 and 68, can be varied, either raised or lowered by varying the RC time constant of the resistor capacitor parallel combination that includes capacitors 64 and 65.

The time constant of the resistor capacitor combination can be lowered by switching in parallel with resistor 63, resistors 22 or 66 or both resistors 22 and 66. Resistor 22 is placed in parallel with resistor 63 by closing switch 29 which places the input terminal of OR gate 69 to ground or logic zero and causes a positive logic level to be at terminal C of an FET gate 70 that connects terminal A to terminal B connecting resistor 22 to ground 44 and thus in parallel with resistor 63. The parellel combination will lower the resistance of the resistor capacitor network and therefore, decrease the time constant of the resistor capacitor network.

In a similar fashion by closing switch 31 of FIG. 1, removing the positive logic level that has been maintained on the input to the OR gate 71 by the biasing resistor 35 which is connected to a positive DC source, will cause a positive logic level to be provided on terminal C of the FET gate 72. This action will place resistor 66 in parallel with resistor 63. If both the level two select switch 29 and the level four select switch 31 are closed, both resistors 22 and 66 will be placed in parallel with resistor 63 providing the shortest time constant for the integrator circuit that is part of the averaging detector 11, and thus lowering the voltage level that is maintained between node 68 and ground 44. This of course will be based upon the same amplitude and frequency signal being passed by the low frequency bandpass filter 9.

The low frequency bandpass filter 9 is biased by the voltage level from a voltage source VDC (not shown), resistor 73, and diode 74 to provide a positive input to the anode of the detector diode 60, thus biasing detector diode 60.

The syllabic detector 13 has an operational amplifier 75 that is arranged in a comparator configuration. The operational amplifier 75 will have on its output terminal a positive signal if the magnitude of the signal on its positive terminal is greater than the magnitude of the signal on its negative terminal and a negative output signal when the magnitude of the signal present on the negative terminal is greater than the magnitude of the signal that is present on the positive terminal. When the magnitude or voltage level or the signal present on the positive terminal is equal to the magnitude of voltage level of the signal present on the negative terminal, the output of the operational amplifier 75 will be zero. During the period of time when there is nonsyllabic information in the demodulated signal provided by the radio receiver 10, the voltage level present on the negative terminal of operational amplifier 75, as a result of charging of capacitor 76, is equal to the magnitude of the voltage present at node 68, which results from the charging of capacitor 64. When the magnitude of the voltage applied to the negative terminal of operational amplifier 75 is equal to the magnitude of the voltage that is divided by the resistor divider network that includes resistors 77 and 78, the output of the operational amplifier 75 is a negative output because the voltage that is applied to the positive terminal of the amplifier 7 is less than the voltage applied to the negative terminal of the operational amplifier 75. When there is speech or audio information contained in the demodulated signal that is present on conductor 46, the detector diode 60 passes a varying DC signal that is integrated by the averaging detector 11. The potential at node 68 increases as a result of the integration of the demodulated signal containing audio information, and operational amplifier 75 will have an increasingly more positive signal on its positive terminal than on its negative terminal if the rate in which the signal at node 68 is increasing is substantially less than the time constant that is established by the capacitor 76 and resistor 79 that connects capacitor 76 to node 68. Operational amplifier 75, under these conditions, provides a positive, logic one, output indicating the present of syllabic data.

The high pass channel 14 includes a high frequency bandpass filter 17 which as was discussed earlier is the same configuration in the preferred embodiment as the low frequency bandpass filter 9. The high frequency bandpass filter 17 has an operational amplifier 75 which is arranged in conjunction with resistors 81, 82, 83 and capacitors 84 and 85 as an active filter with a bandwidth of 300 hertz and a center frequency of 2300 hertz. The value of the resistors 81, 82, 83 and capacitors 84 and 85 are listed in Table 1, as well as the value of the other components used in FIG. 2, and are used to select the bandwidth and center frequencies of the high frequency bandpass filter 17. As was the case with the low frequency bandpass filter 9, the current flow through resistor 73 and diode 74 from the VDC voltage source provide a biasing potential. The positive terminal of the operational amplifier 80 is biased by the biasing potential which causes the detector diode 86 to be biased.

The peak detector 19 includes the detector diode 86 and an integrator that includes resistors 87 and 88 and capacitors 89 and 90. The detector diode 86 will pass a signal that is more positive than the voltage that results from the charge that is present across capacitor 89. This potential is also present during steady state conditions across capacitor 90. When the demodulated signal from the radio receiver 10 contains signals of the frequencies that are passable by the high frequency bandpass filter 17, the voltage level that results from the charging of capacitors 89 and 90 increases. Level comparator 21 compares the signal that is present on its negative terminal and across the capacitor 90 with the signal that is present at node 68, and connected to its positive terminals. When the demodulated signal that is provided by the radio receiver 10 is a broad bandwidth noise level then the voltage levels at the positive terminal of the level comparator 21 and the voltage level at the negative terminal are equal, the output from the operational amplifier will be zero indicating the presence of nonsyllabic data. High frequency noise will cause the signal on the negative terminal to be greater than the signal that is on the positive terminal indicating noise and not the presence of audio information or speech. When the voltage level present at node 68 exceeds the voltage level that is present on the negative terminal of the level comparator 21 then there is a positive output from the level comparator 21 indicating that the energy provided in the signal demodulated by the radio receiver 10 is of the appropriate level to have been produced by speech or audio information.

The AND gate 15 has an operational amplifier 95 that is biased to provide a logic zero output or a negative potential on its output terminal due to the voltage divider network that includes the series combination of resistors 91 and 92 connected between the positive DC source and ground, biasing the negative terminal of the operational amplifier 95. The operational amplifier 95 will provide a positive voltage output or a logic one output only when the output of the level comparator 21 is a logic one or positive voltage, as well as the output from the operational amplifier 75 being a logic one or a positive voltage. The output from the operational amplifier 75 is connected to the positive terminal of the operational amplifier 95 by resistor 94. Similarly the output from the level comparator 21 is connected to the positive terminal of the operational amplifier 95 by resistor 93.

TABLE I

| PART NUMBER OR SIZE | REFERENCE NUMBERS |
| --- | --- |
| μA747 | 21, 48, 51, 54, 75, 80, 95 |
| 47KΩ | 47 |
| 10KΩ | 45, 52, 66 |
| 4001 | 41, 69, 71 |
| 4066 | 4, 70, 72 |
| 22KΩ | 22, 92 |
| 2.2KΩ | 49, 53, 61 |
| 1N4454 | 50, 60, 74, 86, 96 |
| 53.6KΩ | 55, 81 |
| 750Ω | 56 |
| 107Ω | 57 |

TABLE I-continued

| PART NUMBER OR SIZE | REFERENCE NUMBERS |
|---|---|
| 0.01μF | 58, 59, 84, 85 |
| 4.7KΩ | 62, 88 |
| 15KΩ | 63, 87 |
| 2.2μF | 64, 76 |
| 1.0μF | 65, 89, 99 |
| 82KΩ | 77 |
| 470KΩ | 78 |
| 100KΩ | 35, 79, 91, 93, 94 |
| 422Ω | 82 |
| 107KΩ | 83 |
| 1MΩ | 97, 98 |

Diode 96 is a blocking diode that protects the audio gate 3 from the negative potential that is present on the output of the diode 96 during the non-detection of audio information or speech in the demodulated signal from the radio receiver 10. The time delay 25 is achieved by the RC time constant of the resistor and capacitor combination that includes the resistors 97 and 98 and the capacitor 99.

In conclusion, the squelch circuit disclosed has an automatic level control because the noise level does not affect the operation of the squelch circuit due to the fact that the squelch circuit obtains a difference between the high frequency noise and the low frequency noise from the level comparator 21. If the low frequency noise is greater in magnitude than the high frequency noise and the syllabic rate detector detects the presence of syllabic energy that indicates speech, the squelch circuit will only then activate the audio gate 3 and pass audio information to the output device.

Many changes and modifications in the above described embodiments of the invention can, of course, be carried out without departing from the scope thereof. Accordingly, the invention is disclosed and is intended to be limited only by the scope of the appended claims.

I claim:

1. A squelch circuit for a radio receiver comprising:
 a low pass channel means for receiving a demodulated signal from the radio receiver including, a low frequency bandpass filter means for passing only signals with a first predetermined bandwidth and center frequency to provide a first filtered signal, averaging detector means for obtaining the average of the energy in the first filtered signal and to provide an average signal thereby, and syllabic detector means for detecting in the average signal, the presence of speech in the demodulated signal and to provide an indicator signal if speech is detected in the demodulated signal;
 a high pass channel means for receiving the demodulated signal from the radio receiver including, a a high frequency bandpass filter means for passing only signals with a second predetermined bandwidth and center frequency to provide a second filtered signal therefrom, a peak detector means for detecting concentration of energy and to provide a peak signal therefrom, and a level comparator means for comparing the average signal with the peak signal and to provide a positive signal when the average signal is larger than the peak signal; and
 an AND gate means for ANDing the indicator signal with the positive signal and to provide an activate signal therefrom.

2. The squelch circuit according to claim 1 further comprising:
 a signal-to-noise level control means for adjusting the signal-to-noise level of the averaging detector.

3. The squelch circuit according to claims 1 or 2 further comprising:
 an output means for responding to the demodulated signal; and
 gate means controlled by the activate signal for applying the demodulated signal to the output means on command of the activate signal.

4. The squelch circuit according to claim 3 further comprising:
 time delay means for delaying by a predetermined time delay the activate signal.

5. A method for squelching undesirable noise in the output device of a radio receiver comprising the steps of:
 applying a demodulated signal from the radio receiver to a low pass channel that implements the steps of passing the demodulated signal through a low frequency bandpass filter to obtain a first filtered signal of a first predetermined bandwidth and center frequency, averaging the first filtered signal to obtain an average signal thereby, and detecting syllabic rates in the average signal to obtain an indication signal if syllabic rates are detected;
 applying the demodulated signal to a high pass channel that implements the steps of, passing the signal through a high frequency bandpass filter to obtain a second filtered signal with a second predetermined bandwidth and center frequency, detecting the concentration of energy in the second filtered signal and obtaining a peak signal therefrom and comparing the peak signal with the average signal to obtain a positive signal; and
 ANDing the positive signal with the indication signal to provide an activate signal therefrom.

* * * * *